US008254605B2

(12) United States Patent
Van Schaack et al.

(10) Patent No.: US 8,254,605 B2
(45) Date of Patent: Aug. 28, 2012

(54) BINAURAL RECORDING FOR SMART PEN COMPUTING SYSTEMS

(75) Inventors: Andy Van Schaack, Nashville, TN (US); Frank Canova, Fremont, CA (US); Byron Connell, Menlo Park, CA (US); Rick Lewis, Palo Alto, CA (US)

(73) Assignee: Livescribe, Inc., Oakland, CA (US)

( * ) Notice: Subject to any disclaimer, the term of this patent is extended or adjusted under 35 U.S.C. 154(b) by 1101 days.

(21) Appl. No.: 12/129,579

(22) Filed: May 29, 2008

(65) Prior Publication Data

US 2009/0022343 A1 Jan. 22, 2009

Related U.S. Application Data

(60) Provisional application No. 60/940,662, filed on May 29, 2007.

(51) Int. Cl.

| | |
|---|---|
| ***H04R 5/02*** | (2006.01) |
| ***H04R 1/10*** | (2006.01) |
| ***H04R 1/02*** | (2006.01) |
| ***H03B 29/00*** | (2006.01) |
| ***G10K 11/16*** | (2006.01) |
| ***G06F 3/033*** | (2006.01) |

(52) U.S. Cl. ........... 381/309; 381/71.1; 381/74; 381/91; 381/334; 345/179

(58) Field of Classification Search .................. 381/309, 381/71.1, 74, 91, 334; 345/179

See application file for complete search history.

(56) References Cited

U.S. PATENT DOCUMENTS

| | | | | |
|---|---|---|---|---|
| 7,065,219 | B1 * | 6/2006 | Abe et al. | 381/74 |
| 7,142,197 | B2 * | 11/2006 | Wang et al. | 345/179 |
| 7,175,095 | B2 | 2/2007 | Pettersson et al. | |
| 7,281,664 | B1 | 10/2007 | Thaeler et al. | |
| 7,734,055 | B2 * | 6/2010 | Chiloyan | 381/309 |
| 2001/0053228 | A1 * | 12/2001 | Jones | 381/71.6 |
| 2002/0163511 | A1 * | 11/2002 | Sekendur | 345/179 |
| 2004/0125964 | A1 * | 7/2004 | Graham et al. | 381/74 |
| 2004/0229195 | A1 | 11/2004 | Marggraff et al. | |
| 2004/0260470 | A1 * | 12/2004 | Rast | 701/300 |
| 2005/0064915 | A1 * | 3/2005 | Lair | 455/569.1 |

(Continued)

FOREIGN PATENT DOCUMENTS

WO WO 2007/141204 A1 12/2007

OTHER PUBLICATIONS

PCT International Search Report and Written Opinion PCT/US08/65155, Aug. 21, 2008, 9 pages.

*Primary Examiner* — David Warren
*Assistant Examiner* — Christina Russell
(74) *Attorney, Agent, or Firm* — Fenwick & West LLP

(57) ABSTRACT

A pen based computing system concurrently captures handwriting gestures and records audio using binaural recording. A binaural headset communicatively coupled to the smart pen device uses at least two microphones. A left microphone is placed in or near the left ear and the right microphone is placed in or near the right ear, each facing outward. Speakers are integrated into a shared housing with the microphones facing inward towards the ear canal to play back the audio recordings. By recording audio with microphones placed close to the ears, the system provides realistic sounding playback and allows users to more easily differentiate between multiple sources of audio.

21 Claims, 6 Drawing Sheets

U.S. PATENT DOCUMENTS

2005/0110778 A1* 5/2005 Ben Ayed ..................... 345/179
2005/0195988 A1* 9/2005 Tashev et al. ................... 381/92
2005/0207592 A1* 9/2005 Sporer et al. ................. 381/94.2
2005/0281427 A1* 12/2005 Gantz et al. ................... 381/370
2006/0033725 A1 2/2006 Marggraff et al.
2006/0066591 A1 3/2006 Marggraff et al.
2006/0067576 A1 3/2006 Marggraff et al.
2006/0067577 A1 3/2006 Marggraff et al.
2006/0077184 A1 4/2006 Marggraff et al.
2006/0078866 A1 4/2006 Marggraff et al.
2006/0080608 A1 4/2006 Marggraff et al.
2006/0080609 A1* 4/2006 Marggraff ..................... 715/727
2006/0125805 A1 6/2006 Marggraff et al.
2006/0126881 A1* 6/2006 Ito et al. ........................ 381/374
2006/0127872 A1* 6/2006 Marggraff ..................... 434/353
2006/0215847 A1* 9/2006 Hollemans et al. ............. 381/74
2006/0227976 A1* 10/2006 Csermak et al. .................. 381/1
2006/0252470 A1* 11/2006 Seshadri et al. ........... 455/575.2
2006/0292543 A1 12/2006 Marggraff et al.
2007/0097100 A1 5/2007 Marggraff et al.
2007/0176909 A1* 8/2007 Pavlowski ..................... 345/179
2007/0205996 A1* 9/2007 Huang .......................... 345/179
2007/0280627 A1 12/2007 Marggraff et al.
2009/0022332 A1* 1/2009 Van Schaack et al. ....... 381/71.1
2009/0245532 A1* 10/2009 Hupkes et al. .................. 381/74

* cited by examiner

BINAURAL RECORDING FOR SMART PEN COMPUTING SYSTEMS

CROSS REFERENCE TO RELATED APPLICATIONS

This application claims the benefit of U.S. Provisional Application No. 60/940,662, filed May 29, 2007, which is incorporated by reference in its entirety.

BACKGROUND

This invention relates generally to pen-based computing systems, and more particularly to recording audio in a pen-based computing system.

When trying to absorb a large amount of information delivered orally and possibly visually, such as in a business meeting or classroom setting, people commonly use a pen to take notes on paper. However, once disembodied from the oral presentation in which they were taken, even good notes lose much of their meaning because the context for the notes has been lost. For this reason, people often record a presentation as well as take notes. Since people commonly use a pen to take the notes, it is convenient to incorporate a microphone into the pen. In smart pen computing system, for example, a microphone may be embedded into the smart pen to record audio data while the user takes notes.

However, mobile audio recording devices typically use a single microphone that has not been tuned to the physical environments where the recording takes place. Additionally, these microphones typically are used to record a single audio source (e.g. classroom lecturer) but often in a setting where there may be multiple other audio sources (e.g. fellow classmates in the lecture). In addition, small audio recording devices, such as may be embedded into a pen, typically lack acceptable far field recording capabilities. As a result, in an environment where there are multiple sources of audio (e.g. a meeting room with several people, or a classroom where the lecturer and fellow classmates are speaking simultaneously) or where the desired source is at some distance from the recording device, it can be difficult to identify the desired source when the recorded audio is replayed.

Accordingly, new approaches to recording audio are needed to fill the needs unmet by existing methods.

SUMMARY

A pen-based computing system records and plays back audio. A left audio device is adapted to fit proximate to a user's left ear. The left audio device includes an integrated left microphone for recording a left audio channel, and an integrated left speaker for playing back the recorded left audio channel. A right audio device is similarly adapted to fit proximate to a user's right ear and includes an integrated right microphone for recording a right audio channel, and an integrated right speaker for playing back the recorded right audio channel. A smart pen device captures handwriting gestures and records the left and right audio channels from the left and right audio device. The smart pen furthermore synchronizes the handwriting gestures in time with the left and right audio channels. An interface transmits audio from the left and right microphones to the smart pen, and from the smart pen to the left and right speakers for playback.

In one embodiment, the left and right audio device comprise left and right earbuds adapted to be placed substantially within the ears. The microphones face away from the ears while the speakers face towards the ears. In another embodiment, the audio devices comprise earclips adapted to be worn on the outer ear. In another embodiment, a rigid band is shaped for placement around the neck with the left and right audio devices connected to each end of the rigid band. In yet another embodiment, a flexible strap for hanging around the neck connects to the left audio device on one end and the right audio device on the other end.

In one embodiment, a connector plug for interfacing between the headset and the smart pen includes a left audio input channel, a left audio output channel, a right audio input channel, a right audio output channel, and a ground. The connector plug may also include a volume control for controlling the speaker output volume.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview of Pen-Based Computing System

Figure 1:
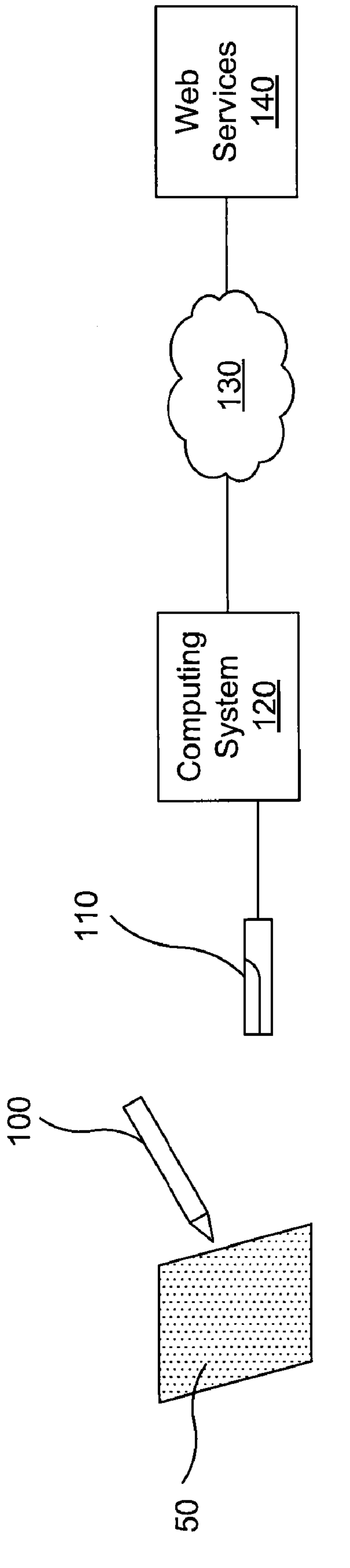
FIG. 1 is a schematic diagram of a pen-based computing system, in accordance with an embodiment of the invention.

Embodiments of the invention may be implemented on various embodiments of a pen-based computing system, and other computing and/or recording systems. An embodiment of a pen-based computing system is illustrated in FIG. 1. In this embodiment, the pen-based computing system comprises a writing surface 50, a smart pen 100, a docking station 110, a client system 120, a network 130, and a web services system 140. The smart pen 100 includes onboard processing capabilities as well as input/output functionalities, allowing the pen-based computing system to expand the screen-based interactions of traditional computing systems to other surfaces on which a user can write. For example, the smart pen 100 may be used to capture electronic representations of writing as well as record audio during the writing, and the smart pen 100 may also be capable of outputting visual and audio information back to the user. With appropriate software on the smart pen 100 for various applications, the pen-based computing system thus provides a new platform for users to interact with software programs and computing services in both the electronic and paper domains.

In the pen based computing system, the smart pen 100 provides input and output capabilities for the computing system and performs some or all of the computing functionalities of the system. Hence, the smart pen 100 enables user interaction with the pen-based computing system using multiple modalities. In one embodiment, the smart pen 100 receives input from a user, using multiple modalities, such as capturing a user's writing or other hand gesture or recording audio, and provides output to a user using various modalities, such as displaying visual information or playing audio. In other embodiments, the smart pen 100 includes additional input modalities, such as motion sensing or gesture capture, and/or additional output modalities, such as vibrational feedback.

Figure 2:
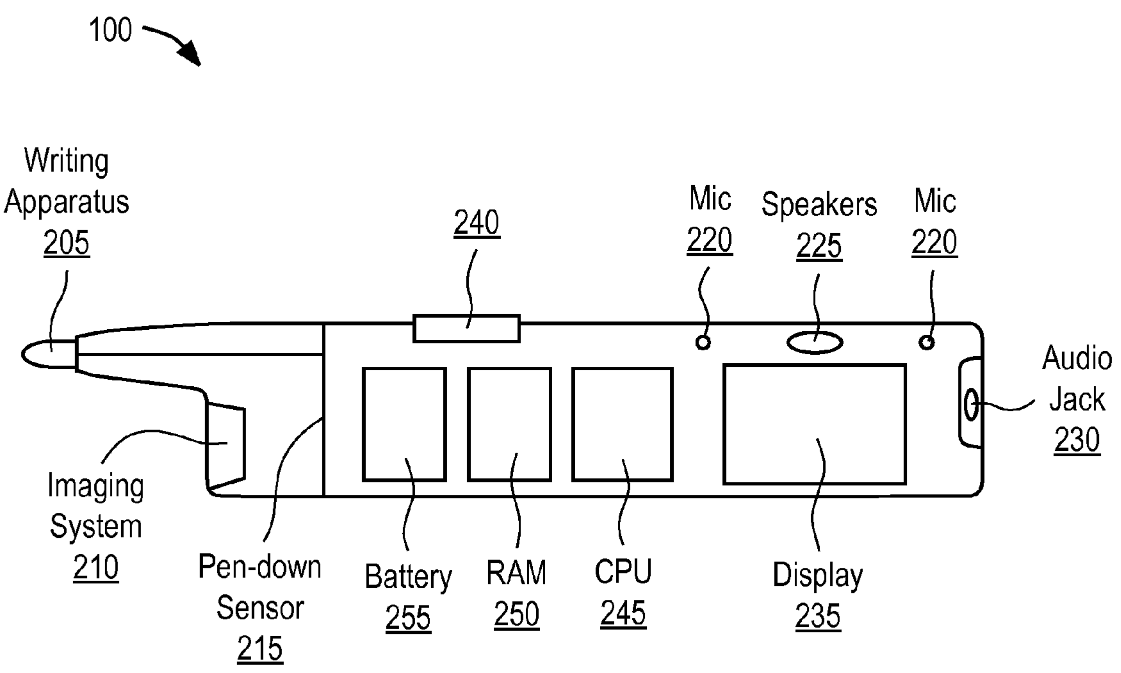
FIG. 2 is a diagram of a smart pen for use in the pen-based computing system, in accordance with an embodiment of the invention.

The components of a particular embodiment of the smart pen 100 are shown in FIG. 2 and described in more detail in the accompanying text. The smart pen 100 preferably has a form factor that is substantially shaped like a pen or other writing implement, although certain variations on the general shape may exist to accommodate other functions of the pen, or may even be an interactive multi-modal non-writing implement. For example, the smart pen 100 may be slightly thicker than a standard pen so that it can contain additional components, or the smart pen 100 may have additional structural features (e.g., a flat display screen) in addition to the structural features that form the pen shaped form factor. Additionally, the smart pen 100 may also include any mechanism by which a user can provide input or commands to the smart pen computing system or may include any mechanism by which a user can receive or otherwise observe information from the smart pen computing system.

The smart pen 100 is designed to work in conjunction with the writing surface 50 so that the smart pen 100 can capture writing that is made on the writing surface 50. In one embodiment, the writing surface 50 comprises a sheet of paper (or any other suitable material that can be written upon) and is encoded with a pattern that can be read by the smart pen 100. An example of such a writing surface 50 is the so-called "dot-enabled paper" available from Anoto Group AB of Sweden (local subsidiary Anoto, Inc. of Waltham, Mass.), and described in U.S. Pat. No. 7,175,095, incorporated by reference herein. This dot-enabled paper has a pattern of dots encoded on the paper. A smart pen 100 designed to work with this dot enabled paper includes an imaging system and a processor that can determine the position of the smart pen's writing tip with respect to the encoded dot pattern. This position of the smart pen 100 may be referred to using coordinates in a predefined "dot space," and the coordinates can be either local (i.e., a location within a page of the writing surface 50) or absolute (i.e., a unique location across multiple pages of the writing surface 50).

In other embodiments, the writing surface 50 may be implemented using mechanisms other than encoded paper to allow the smart pen 100 to capture gestures and other written input. For example, the writing surface may comprise a tablet or other electronic medium that senses writing made by the smart pen 100. In another embodiment, the writing surface 50 comprises electronic paper, or e-paper. This sensing may be performed entirely by the writing surface 50 or in conjunction with the smart pen 100. Even if the role of the writing surface 50 is only passive (as in the case of encoded paper), it can be appreciated that the design of the smart pen 100 will typically depend on the type of writing surface 50 for which the pen based computing system is designed. Moreover, written content may be displayed on the writing surface 50 mechanically (e.g., depositing ink on paper using the smart pen 100), electronically (e.g., displayed on the writing surface 50), or not at all (e.g., merely saved in a memory). In another embodiment, the smart pen 100 is equipped with sensors to sensor movement of the pen's tip, thereby sensing writing gestures without requiring a writing surface 50 at all. Any of these technologies may be used in a gesture capture system incorporated in the smart pen 100.

In various embodiments, the smart pen 100 can communicate with a general purpose computing system 120, such as a personal computer, for various useful applications of the pen based computing system. For example, content captured by the smart pen 100 may be transferred to the computing system 120 for further use by that system 120. For example, the computing system 120 may include management software that allows a user to store, access, review, delete, and otherwise manage the information acquired by the smart pen 100. Downloading acquired data from the smart pen 100 to the computing system 120 also frees the resources of the smart pen 100 so that it can acquire more data. Conversely, content may also be transferred back onto the smart pen 100 from the computing system 120. In addition to data, the content provided by the computing system 120 to the smart pen 100 may include software applications that can be executed by the smart pen 100.

The smart pen 100 may communicate with the computing system 120 via any of a number of known communication mechanisms, including both wired and wireless communications. In one embodiment, the pen based computing system includes a docking station 110 coupled to the computing system. The docking station 110 is mechanically and electrically configured to receive the smart pen 100, and when the smart pen 100 is docked the docking station 110 may enable electronic communications between the computing system 120 and the smart pen 100. The docking station 110 may also provide electrical power to recharge a battery in the smart pen 100.

FIG. 2 illustrates an embodiment of the smart pen 100 for use in a pen based computing system, such as the embodiments described above. In the embodiment shown in FIG. 2, the smart pen 100 comprises a marker 205, an imaging system 210, a pen down sensor 215, one or more microphones 220, a speaker 225, an audio jack 230, a display 235, an I/O port 240, a processor 245, an onboard memory 250, and a battery 255. It should be understood, however, that not all of the above components are required for the smart pen 100, and this is not an exhaustive list of components for all embodiments of the smart pen 100 or of all possible variations of the above components. For example, the smart pen 100 may also include buttons, such as a power button or an audio recording button, and/or status indicator lights. Moreover, as used herein in the specification and in the claims, the term "smart pen" does not imply that the pen device has any particular feature or functionality described herein for a particular embodiment, other than those features expressly recited. A smart pen may have any combination of fewer than all of the capabilities and subsystems described herein.

The marker 205 enables the smart pen to be used as a traditional writing apparatus for writing on any suitable surface. The marker 205 may thus comprise any suitable marking mechanism, including any ink-based or graphite-based marking devices or any other devices that can be used for writing. In one embodiment, the marker 205 comprises a replaceable ballpoint pen element. The marker 205 is coupled to a pen down sensor 215, such as a pressure sensitive element. The pen down sensor 215 thus produces an output when the marker 205 is pressed against a surface, thereby indicating when the smart pen 100 is being used to write on a surface.

The imaging system 210 comprises sufficient optics and sensors for imaging an area of a surface near the marker 205. The imaging system 210 may be used to capture handwriting and gestures made with the smart pen 100. For example, the imaging system 210 may include an infrared light source that illuminates a writing surface 50 in the general vicinity of the marker 205, where the writing surface 50 includes an encoded pattern. By processing the image of the encoded pattern, the smart pen 100 can determine where the marker 205 is in relation to the writing surface 50. An imaging array of the imaging system 210 then images the surface near the marker 205 and captures a portion of a coded pattern in its field of view. Thus, the imaging system 210 allows the smart pen 100 to receive data using at least one input modality, such as receiving written input. The imaging system 210 incorporating optics and electronics for viewing a portion of the writing surface 50 is just one type of gesture capture system that can be incorporated in the smart pen 100 for electronically capturing any writing gestures made using the pen, and other embodiments of the smart pen 100 may use any other appropriate means for achieve the same function.

In an embodiment, data captured by the imaging system 210 is subsequently processed, allowing one or more content recognition algorithms, such as character recognition, to be applied to the received data. In another embodiment, the imaging system 210 can be used to scan and capture written content that already exists on the writing surface 50 (e.g., and not written using the smart pen 100). The imaging system 210 may further be used in combination with the pen down sensor 215 to determine when the marker 205 is touching the writing surface 50. As the marker 205 is moved over the surface, the pattern captured by the imaging array changes, and the user's handwriting can thus be determined and captured by a gesture capture system (e.g., the imaging system 210 in FIG. 2) in the smart pen 100. This technique may also be used to capture gestures, such as when a user taps the marker 205 on a particular location of the writing surface 50, allowing data capture using another input modality of motion sensing or gesture capture.

Another data capture device on the smart pen 100 are the one or more microphones 220, which allow the smart pen 100 to receive data using another input modality, audio capture. The microphones 220 may be used for recording audio, which may be synchronized to the handwriting capture described above. In an embodiment, the one or more microphones 220 are coupled to signal processing software executed by the processor 245, or by a signal processor (not shown), which removes noise created as the marker 205 moves across a writing surface and/or noise created as the smart pen 100 touches down to or lifts away from the writing surface. In an embodiment, the processor 245 synchronizes captured written data with captured audio data. For example, a conversation in a meeting may be recorded using the microphones 220 while a user is taking notes that are also being captured by the smart pen 100. Synchronizing recorded audio and captured handwriting allows the smart pen 100 to provide a coordinated response to a user request for previously captured data. For example, responsive to a user request, such as a written command, parameters for a command, a gesture with the smart pen 100, a spoken command or a combination of written and spoken commands, the smart pen 100 provides both audio output and visual output to the user. The smart pen 100 may also provide haptic feedback to the user. The use of microphones 220 for recording audio in the smart pen 100 is discussed in more detail below.

In an alternative embodiment, one or more microphones may be external to the smart pen 100 and communicate captured audio data to the smart pen 100 via the audio jack 230 or via a wireless interface. An example embodiment of an external microphone system for use with the smart pen 100 is described in more detail below with reference to FIG. 3.

The speaker 225, audio jack 230, and display 235 provide outputs to the user of the smart pen 100 allowing presentation of data to the user via one or more output modalities. The audio jack 230 may be coupled to earphones so that a user may listen to the audio output without disturbing those around the user, unlike with a speaker 225. The audio jack 230 may also be used as an input from external microphones. Earphones may also allow a user to hear the audio output in stereo or full three-dimensional audio that is enhanced with spatial characteristics. Hence, the speaker 225 and audio jack 230 allow a user to receive data from the smart pen using a first type of output modality by listening to audio played by the speaker 225 or the audio jack 230.

The display 235 may comprise any suitable display system for providing visual feedback, such as an organic light emitting diode (OLED) display, allowing the smart pen 100 to provide output using a second output modality by visually displaying information. In use, the smart pen 100 may use any of these output components to communicate audio or visual feedback, allowing data to be provided using multiple output modalities. For example, the speaker 225 and audio jack 230 may communicate audio feedback (e.g., prompts, commands, and system status) according to an application running on the smart pen 100, and the display 235 may display word phrases, static or dynamic images, or prompts as directed by such an application. In addition, the speaker 225 and audio jack 230 may also be used to play back audio data that has been recorded using the microphones 220.

The input/output (I/O) port 240 allows communication between the smart pen 100 and a computing system 120, as described above. In one embodiment, the I/O port 240 comprises electrical contacts that correspond to electrical contacts on the docking station 110, thus making an electrical connection for data transfer when the smart pen 100 is placed in the docking station 110. In another embodiment, the I/O port 240 simply comprises a jack for receiving a data cable (e.g., Mini-USB or Micro-USB). Alternatively, the I/O port 240 may be replaced by a wireless communication circuit in the smart pen 100 to allow wireless communication with the computing system 120 (e.g., via Bluetooth, WiFi, infrared, or ultrasonic).

A processor 245, onboard memory 250, and battery 255 (or any other suitable power source) enable computing functionalities to be performed at least in part on the smart pen 100. The processor 245 is coupled to the input and output devices and other components described above, thereby enabling applications running on the smart pen 100 to use those components. In one embodiment, the processor 245 comprises an ARM9 processor, and the onboard memory 250 comprises a small amount of random access memory (RAM) and a larger amount of flash or other persistent memory. As a result, executable applications can be stored and executed on the smart pen 100, and recorded audio and handwriting can be stored on the smart pen 100, either indefinitely or until offloaded from the smart pen 100 to a computing system 120. For example, the smart pen 100 may locally stores one or more content recognition algorithms, such as character recognition or voice recognition, allowing the smart pen 100 to locally identify input from one or more input modality received by the smart pen 100.

In an embodiment, the smart pen 100 also includes an operating system or other software supporting one or more input modalities, such as handwriting capture, audio capture or gesture capture, or output modalities, such as audio playback or display of visual data. The operating system or other software may support a combination of input modalities and output modalities and manages the combination, sequencing and transitioning between input modalities (e.g., capturing written and/or spoken data as input) and output modalities (e.g., presenting audio or visual data as output to a user). For example, this transitioning between input modality and output modality allows a user to simultaneously write on paper or another surface while listening to audio played by the smart pen 100, or the smart pen 100 may capture audio spoken from the user while the user is also writing with the smart pen 100. Various other combinations of input modalities and output modalities are also possible.

In an embodiment, the processor 245 and onboard memory 250 include one or more executable applications supporting and enabling a menu structure and navigation through a file system or application menu, allowing launch of an application or of a functionality of an application. For example, navigation between menu items comprises a dialogue between the user and the smart pen 100 involving spoken and/or written commands and/or gestures by the user and audio and/or visual feedback from the smart pen computing system. Hence, the smart pen 100 may receive input to navigate the menu structure from a variety of modalities.

For example, a writing gesture, a spoken keyword, or a physical motion, may indicate that subsequent input is associated with one or more application commands. For example, a user may depress the smart pen 100 against a surface twice in rapid succession then write a word or phrase, such as "solve," "send," "translate," "email," "voice-email" or another predefined word or phrase to invoke a command associated with the written word or phrase or receive additional parameters associated with the command associated with the predefined word or phrase. This input may have spatial (e.g., dots side by side) and/or temporal components (e.g., one dot after the other). Because these "quick-launch" commands can be provided in different formats, navigation of a menu or launching of an application is simplified. The "quick-launch" command or commands are preferably easily distinguishable during conventional writing and/or speech.

Alternatively, the smart pen 100 also includes a physical controller, such as a small joystick, a slide control, a rocker panel, a capacitive (or other non-mechanical) surface or other input mechanism which receives input for navigating a menu of applications or application commands executed by the smart pen 100.

Binaural Recording

In one aspect of the invention, the use of binaural recording (audio recordings made with at least two microphones, one placed in or near the first ear, and the other placed in or near the second ear) enables the listener to perceive the spatial characteristics of the audio due to the combined qualities of the two audio channels through interaural intensity difference, interaural time differences, frequency shifting due to physical characteristics of the individual wearing the binaural microphones (such as the reflection and absorption of sound waves interacting with the recorder's head, hair, shoulders, torso, and pinnae), and frequency shifting due to characteristics of the recorded environment (such as the ratio of reverberant sound to source sound). By using binaural recording, voices and other sound sources can be more easily perceived during playback than those recordings made with a single microphone or two microphones merely separated by a distance. Audio perceivability typically is boosted by approximately 6-9 dB through spatial localization as a result of a psychological phenomenon known as "The Cocktail Party Effect." In addition, two individuals with similar voices can be more easily differentiated when their voices are heard as coming from different locations.

Recording with two audio channels can also provide additional fidelity through two separate factors that together are known as binaural summation. The first factor is primarily statistical. The threshold for perceptibility is enhanced by more than 140% when a signal is captured by two independent sensors. In the case of hearing, the probability of perceiving a stimulus (Pb) is equal to the probability of perceiving the stimulus with the left ear (Pl) plus the probability of perceiving the stimulus with the right ear (Pr) minus the product of the probabilities of perceiving it with both ears (Pl×Pr), assuming that Pr and Pl are independent. This function can be expressed as $$Pb=Pr+Pl-(Pr\times Pl).$$

For example, if the probability of perceiving a stimulus with each ear is 0.6, then $$Pb=0.6+0.6-(0.6\times 0.6)=0.84,$$

which is 40% greater than the probability for one ear alone.

The second factor is primarily neural. When two similar signals are received by the brain, the effect is additive. With noise, the difference between the two signals is random. Similar "bits" of information are added, but dissimilar bits are subtracted. This results in a partial suppression of the noise. The overall net result is an enhancement of the primary signal and a suppression of noise—enhanced perception of audio with two microphones/ear over one microphone/ear.

In another aspect of the invention, a binaural two-way headset allows both recording and playback of binaural audio. For each ear, the headset contains both a speaker that fits proximate to the ear, (e.g., using earbuds-style housings), and a microphone located roughly at the same location as the speaker but facing in the opposite direction. This arrangement is both spatially compact and produces good binaural audio since each earphone and earmic are a complementary pair. The earmic records the sound entering the ear (which is affected by the head related transfer function and other effects), and the earphone replays the same sound emanating from the same location.

Binaural recording can be used in combination with other smart pen features. For example, in one embodiment the smart pen device records audio using two or more microphones and captures handwriting gestures as a user writes on a writing surface. In this manner, the smart pen device can capture, for example, a presentation as a user takes notes related to the audio captured from the speaker. The smart pen computing system can optionally process the audio to enhance the recording. For example, the smart pen may apply beam steering techniques to adjust the relative gain between different sources of audio originating from different directions. In one embodiment, the relative gain is adjusted in real-time and outputted to the left and right speakers to allow a user to focus on audio from a particular audio source. The smart pen computing system then synchronizes the captured audio and gestures in time. Thus, a user can later replay a captured presentation or other recorded audio events and retrieve notes synchronized with the captured audio. Various embodiments, alternatives and other features of the foregoing are described in more detail below.

Embodiments of a Binaural Headset

FIGS. 3-6 illustrate examples of binaural headsets according to the invention. These examples are designed to plug into the audio jack on the smart pen described above with respect to FIG. 2. FIG. 3A illustrates is an "earbud"-style headset adapted to be placed substantially within a user's ears. The headset includes left and right audio devices 302, each including an integrated microphone and speaker. A microphone (earmic) is built into one side of the housing, and a speaker is built into the opposite side of the earbud housing. When worn, the speakers 304 are located substantially within the user's ears while the microphones 306 face away from the ears. FIG. 3B illustrates an example embodiment of the audio device 302 having a speaker 304 on one side of the device. FIG. 3C shows the device from the opposite side where a microphone 306 is located.

Figure 3C:
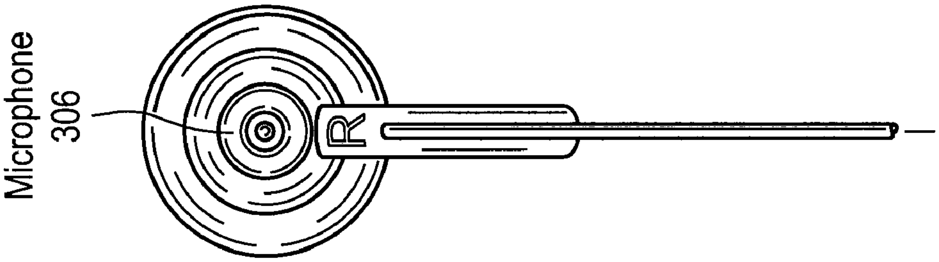
FIG. 3C illustrates a microphone-side view of a binaural headset for audio recording and playback, in accordance with an embodiment of the invention.
Figure 3B:
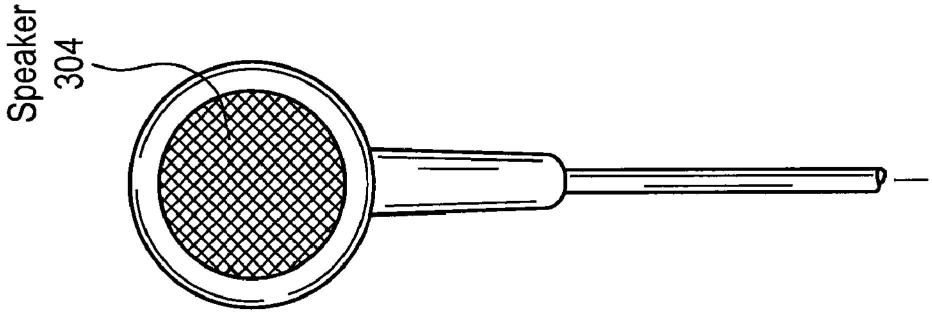
FIG. 3B illustrates a speaker-side view of a binaural headset for audio recording and playback, in accordance with an embodiment of the invention.
Figure 3A:
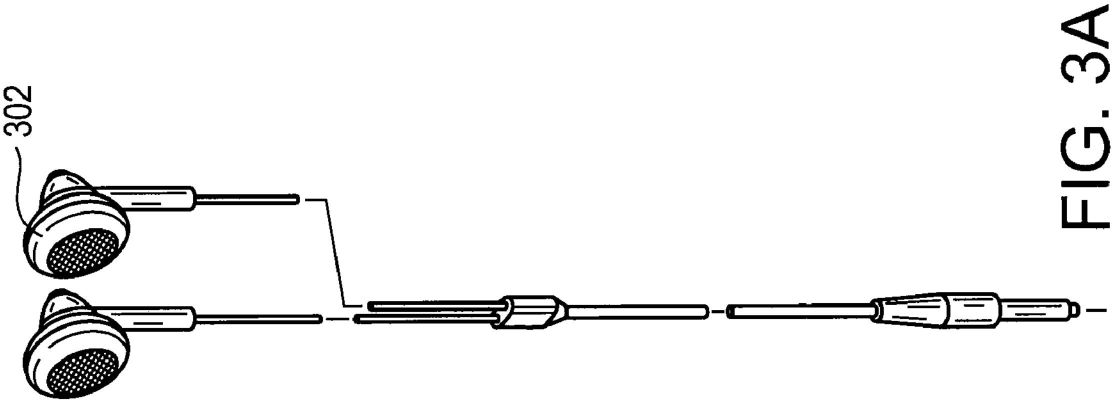
FIG. 3A illustrates an earbud-style binaural headset for audio recording and playback, in accordance with an embodiment of the invention.

Note that the design of FIG. 3A-C is particularly good for binaural recording. Usually, the goal in binaural microphone placement is to intercept sound waves after they have been affected by the head, torso, and outer ears. These combine to what is commonly referred to as the "Head Related Transfer Function" (HRTF). This is done by putting each microphone as close as possible to the entrance of the ear canal. It is desirable to then play back the recorded sounds at the same position at the entrance of the ear canal. Note that playing back sounds recorded with in-ear mics over headphones that cover the entire ear is less than optimal since the outer ear affects the sound waves twice: once during recording and then again during playback. Therefore, the design of FIG. 3 is nearly ideal with respect to binaural fidelity. Ideally, the microphone and speaker would be in the exact same spot just outside of the ear canal. But because this is physically difficult, a good solution is to put the speaker at the entrance of the ear canal pointing into the canal and the microphone just outside of the ear canal pointing out to the world, as in FIG. 3. In a further improvement, a single mechanism is capable of both recording and playing back audio (e.g., a flexible membrane that can be used both as a microphone to convert audio to electrical and driven as a speaker to convert electrical to audio), and that mechanism is located right at the entrance of the ear canal (or at any location inside the ear).

Figure 4B:
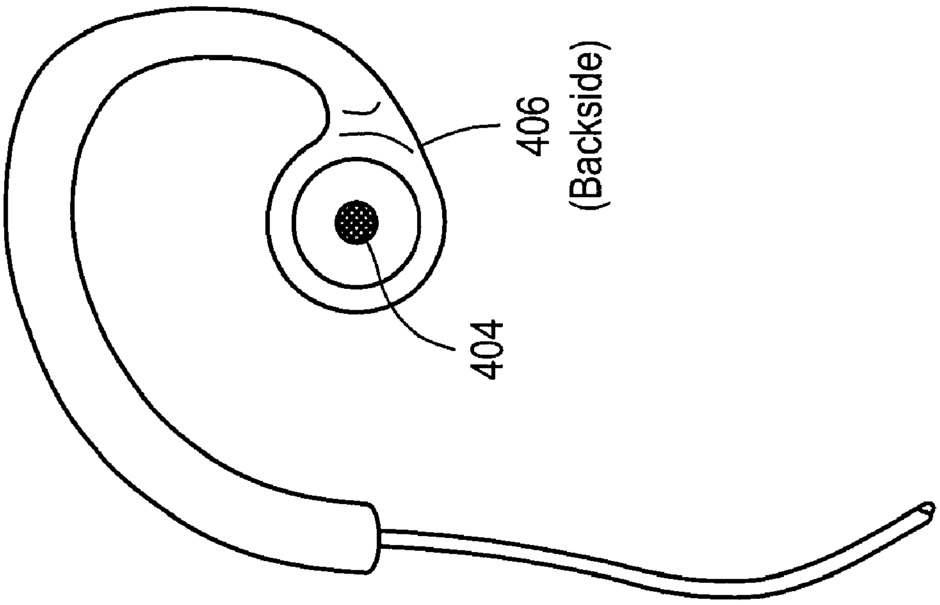
FIG. 4B illustrates an embodiment earclip-style headset having an integrated microphone and speaker.
Figure 4A:
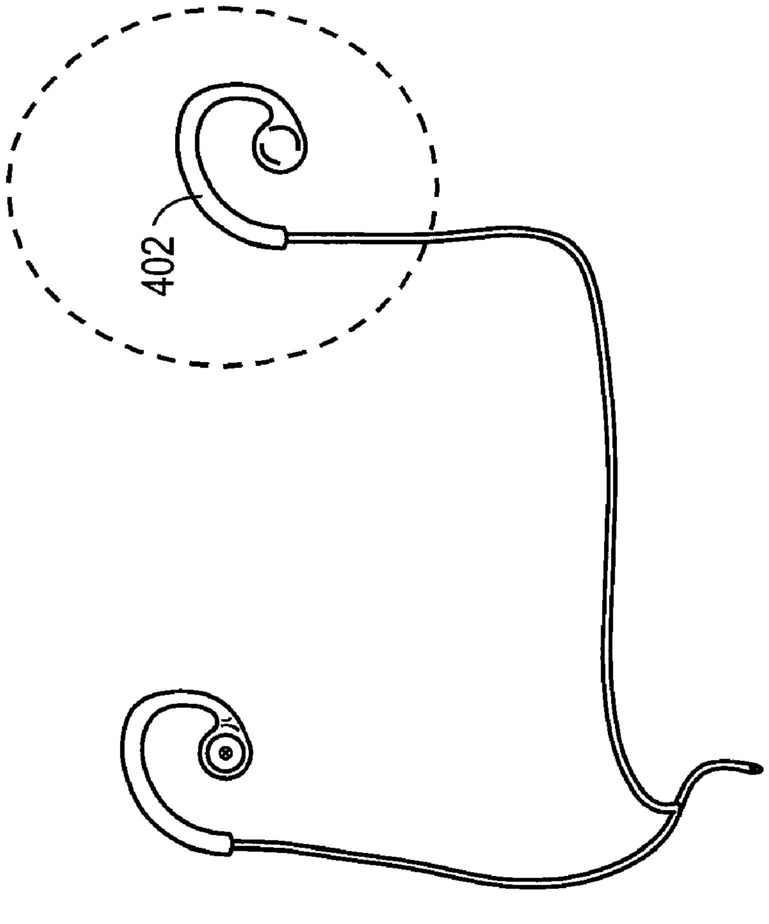
FIG. 4A illustrates an earclip style binaural headset for audio recording and playback, in accordance with an embodiment of the invention.

FIG. 4A illustrates a headset is based on "over-the-ear clips." In this embodiment, left and right audio devices 402 are designed to clip around the outer ear using for example, a soft rubber body. Each audio device 402 again includes an integrated microphone and speaker built into opposite sides of the device 402. FIG. 4B is a more detailed illustration of the portion of the headset within the dotted line of FIG. 4A, showing an embodiment of the earclip-style audio device 402 having the integrated speaker and microphone. In this design, the speaker 406 (on the back side of the device as illustrated) is located proximate to the ear but not in the ear when worn. The earmic 404 is on the opposite side of from the speaker 406 and faces away from the ear when worn.

Note that in both the embodiments of FIGS. 3A-B and FIGS. 4A-B, the speaker (earphones) and microphones (earmics) are designed so they are located at approximately the same location when properly used but are facing opposite directions. This has several advantages. First, the earphones and earmics are integrated into a single device. In contrast, some prior art systems use separate earphones and microphones. The user records using the microphones and then physically swaps them out for the earphones during playback. However, this means the user must carry around two devices (one for recording and another for playback), which is inconvenient and time consuming. A second advantage is that, in the above designs, the earphones and earmics are optimally located at approximately the same location near the entrance to the ear canal but facing opposite directions. This results in a more accurate recording and playback of binaural audio, since the device is not recording audio received at one location and then playing it back from a different location and/or recording audio received from one direction and then playing it back in a different direction.

Figure 5:
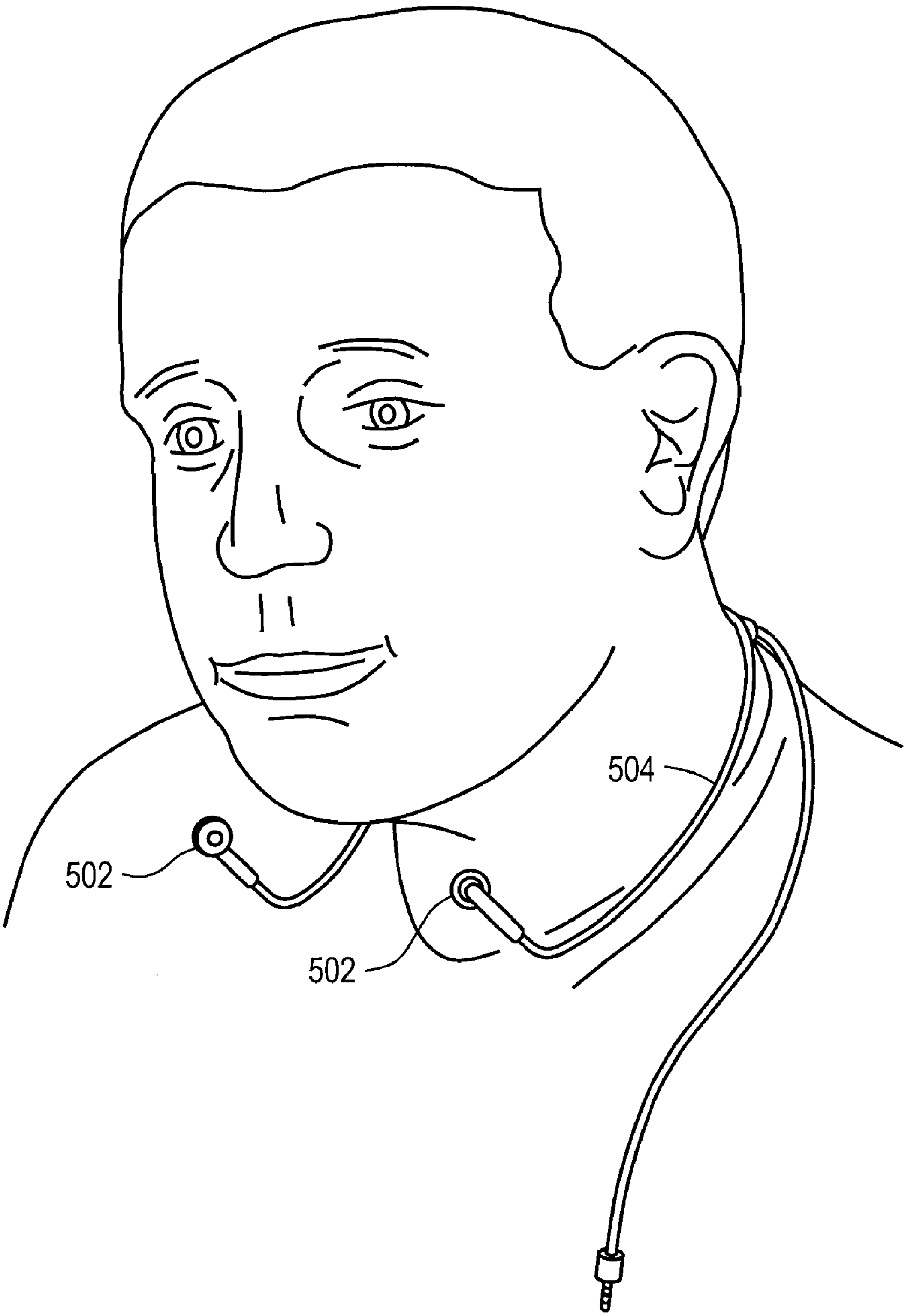
FIG. 5 illustrates an embodiment of a band-style headset for recording and playing back audio.

FIG. 5 illustrates another embodiment of a headset that can be worn away from the ears. For various reasons, a user may not always want to use a headset that places the speakers in or near the user's ears. For example, if a user is recording a lecture, the lecturer (and the user's fellow classmates) might believe that the user is listening to music rather than paying attention, if he is wearing the headset. In this example, the earbud-style audio devices 502 are supported by an adjustable rigid metal band 504 shaped for placement around a user's neck. In one embodiment, the band 504 can be worn around the neck for recording (as illustrated), and raised to the ears for playback. In a variation of the embodiment illustrated in FIG. 5, the short straight ends of the earbud-style audio devices 502 can instead fit into the ends of a "croakie"-style flexible strap instead of the rigid band 504 (e.g., the type which can be attached over the legs of eyeglasses to secure them). The adjustable "croakie" solution allows the user to conveniently dangle the earbuds over his shoulders and on his chest. Because there are still two microphones, separated by a distance approximated the width of the human head, several of the features of binaural recording are maintained: two audio channels, interaural time difference, and the location of a body part (in this case the torso) filters the sounds coming from behind the listener differently than sounds coming from in front of the listener in much the same way that the pinnae (outer ears) function, for example. In other alternative embodiments, the microphone/speakers can be attached to the user in a different manner. For example, the audio device can be fastened to a user's clothing or body using a fastening mechanism such as, for example, pins, clips, magnets, a hook and loop fastener, etc.

Figure 6C:
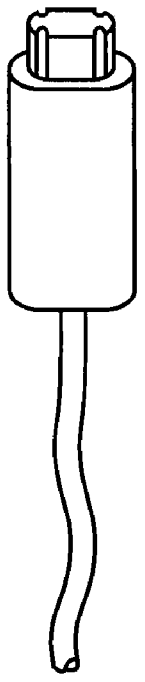
FIG. 6C illustrates an embodiment of a USB connector for coupling a binaural headset to a smart pen device.
Figure 6B:
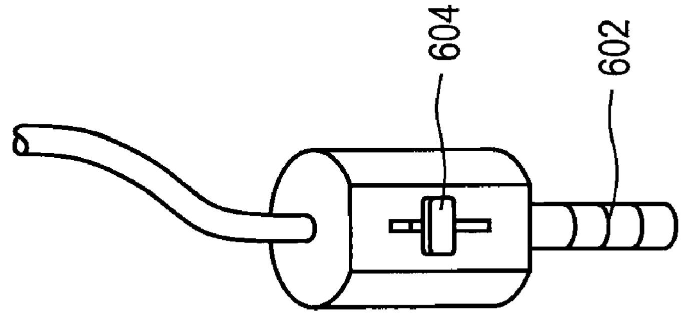
FIG. 6B illustrates an embodiment of a straight connector for coupling a binaural headset to a smart pen device.
Figure 6A:
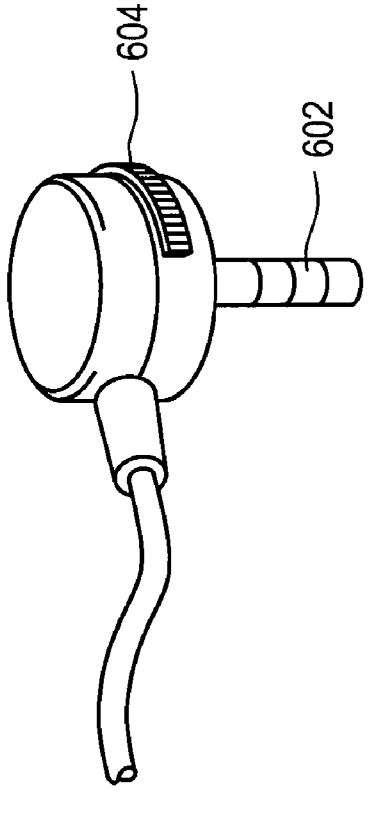
FIG. 6A illustrates an embodiment of a right-angle connector for coupling a binaural headset to a smart pen device.

FIGS. 6A-C shows several embodiments of connectors for coupling the microphone/speaker headset to a smart pen device. FIG. 6A illustrates a right angle connector with four or more conductor bands 602. The conductor bands 602 each conduct one of four audio channels: left input, right input, left output, and right output. In one embodiment, a fifth conductor band is added for ground. In one embodiment, the right angle connector also includes a volume control 604 to control the speaker and/or microphone volume. FIG. 6B illustrates an alternative embodiment of a connector in a straight plug style. This embodiment also includes a plug with four or more conductor bands 602 and a volume control 604. Fewer than five conductors could be used if multiplexing is used, for instance with a USB connector such as that illustrated in FIG. 6C. This embodiment includes a converter to convert audio input and output signals to USB. In one approach, a switch toggles between input and output.

In alternate embodiments, any of the headsets described in FIGS. 3-5 can wirelessly communicate with the smart pen device. In these wireless embodiments, the physical connection between the head set and the smart pen is absent and replaced by wireless transmitters and receivers. For example, in one embodiment, the headset utilizes bluetooth or other wireless technology to transmit information between the smart pen device and the headset in place of the connectors of FIGS. 6A-C.

Additional Embodiments

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal is a product that is presented in a tangible medium or carrier wave and modulated or otherwise encoded in the carrier wave, which is tangible, and transmitted according to any suitable transmission method.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon.

What is claimed is:

1. A pen-based computing system for recording and playing back audio, comprising:

a left audio device adapted to fit proximate to a user's left ear, the left audio device having an integrated left microphone for capturing a left audio input signal, and an integrated left speaker for playing back a left audio output signal;

a right audio device adapted to fit proximate to a user's right ear, the right audio device having an integrated right microphone for capturing a right audio input signal and an integrated right speaker for playing back a right audio output signal;

a connector plug for transferring audio signals between the left audio device, the right audio device, and a smart pen device, the connector plug comprising:

a first conducting surface for transferring the left audio input signal captured by the integrated left microphone from the left audio device to the smart pen device;

a second conducting surface for transferring the right audio input signal captured by the integrated right microphone from the right audio device to the smart pen device;

a third conducting surface for transferring the left audio output signal from the smart pen device to the integrated left speaker of the left audio device; and a fourth conducting surface for transferring the right audio output signal from the smart pen device to the integrated right speaker of the right audio device; and the smart pen device, comprising a connector jack configured to be coupled to the connector plug, the connector jack comprising:

a first conductor configured to be coupled to the first conducting surface of the connector plug;

a second conductor configured to be coupled to the second conducting surface of the connector plug;

a third conductor configured to be coupled to the third conducting surface of the connector plug; and a fourth conductor configured to be coupled to the fourth conducting surface of the connector plug;

the smart pen device configured to record the left audio input signal received over the first conductor and record the right audio input signal received over the second conductor, and to synchronize captured handwriting gestures in time with the left audio input signal and the right audio input signal.

2. The pen-based computing system of claim 1, wherein the left audio device comprises a left earbud housing adapted to be placed in a left ear wherein the integrated left microphone faces away from the left ear and the integrated left speaker faces towards the left ear; and wherein the right audio device comprises a right earbud housing adapted to be placed in a right ear wherein the integrated right microphone faces away from the right ear and the integrated right speaker faces towards the right ear.

3. The pen-based computing system of claim 1, wherein the left audio device comprises a left earclip adapted to clip around a portion of a left ear such that the integrated left microphone faces away from the left ear and the integrated left speaker faces towards the left ear; and wherein the right audio device comprises a right earclip adapted to clip around a portion of a right ear such that the integrated right microphone faces away from the right ear and the integrated right speaker faces towards the right ear.

4. The pen-based computing system of claim 1, further comprising:

a rigid band shaped for placement around a user's neck, wherein the left audio device is connected to a left end of the rigid band and the right audio devices is connected to a right end of the rigid band.

5. The pen-based computing system of claim 1, further comprising:

a first fastening mechanism for attaching the left audio device to a left side of a user's clothing or body; and a second fastening mechanism for attaching the right audio device to a right side of a user's clothing or body.

6. The pen-based computing system of claim 1, further comprising:

a flexible strap for hanging around a user's neck, wherein the left audio device is connected to a first end of the flexible strap and the right audio devices is connected to a second end of the flexible strap.

7. The pen-based computing system of claim 1, wherein the connector plug further comprises an integrated sliding volume controller for controlling speaker output volume.

8. The pen-based computing system of claim 1, wherein the connector plug further comprises:

a ground conducting surface for supplying a reference voltage relative to signals on the first conducting surface, the second conducting surface, the third conducting surface, and the fourth conducting surface.

9. The pen-based computing system of claim 1, wherein the left audio device comprises a first membrane adapted for common use by the left microphone and the left speaker; and wherein the right audio device comprises a second membrane adapted for common use by the right microphone and the right speaker.

10. The pen-based computing system of claim 1, wherein the smart pen device comprises:

a processor for processing the audio captured by the left and right microphones to adjust relative gain between a first audio source originating from a first direction and a second audio source originating from a second direction.

11. The pen-based computing system of claim 10, wherein the processor is programmed to adjust the relative gain between the first audio source and the second audio source in real time and output the processed audio to the left and right speakers.

12. A headset for recording and playing back audio, comprising:

a left earbud adapted to fit substantially within a left ear, the left earbud comprising an integrated left microphone for capturing a left audio input signal and an integrated left speaker for playing back a left audio output signal, the left microphone facing opposite the left speaker;

a right earbud adapted to fit substantially within a right ear, the right earbud comprising an integrated right microphone for capturing a right audio input signal and an integrated right speaker for playing back a right audio output signal, the right microphone facing opposite the right speaker; and a connector plug for transferring audio signals between the left earbud, the right earbud, and a memory, the connector plug comprising:

a first conducting surface for transferring the left audio input signal captured by the integrated left microphone from the left audio device to a memory;

a second conducting surface for transferring the right audio input signal captured by the integrated right microphone from the right audio device to a memory;

a third conducting surface for transferring the left audio output signal from a memory to the integrated left speaker of the left earbud; and a fourth conducting surface for transferring the right audio output signal from a memory to the integrated right speaker of the right earbud.

13. The headset of claim 12, wherein the connector plug further comprises:

a ground conducting surface for supplying a reference voltage relative to the signals on the first conducting surface, the second conducting surface, the third conducting surface, and the fourth conducting surface.

14. The headset of claim 12, wherein the left earbud comprises a first membrane commonly used by the left microphone and the left speaker; and wherein the right earbud comprises a second membrane commonly used by the right microphone and the right speaker.

15. The headset of claim 12, wherein the connector plug further comprises an integrated sliding volume controller for controlling speaker output volume.

16. A method for recording and playing audio in a smart pen computing system, comprising:

recording, at the smart pen, a left audio input signal captured by a left microphone located proximate to a left ear, the left audio input signal received over a first conductor of a connector jack on the smart pen;

recording, at the smart pen, a right audio input signal captured by a right microphone located proximate to a right ear, the right audio input signal received over a second conductor of the connector jack on the smart pen;

capturing, with the smart pen, handwriting gestures concurrently with recording the left audio input signal and the right audio input signal;

synchronizing the recorded left audio signal and the recorded right audio signal with the captured handwriting gestures;

transmitting the recorded left audio signal over a third conductor of the connector jack on the smart pen to be played back on a left speaker, the left speaker sharing a first housing with the left microphone; and transmitting the recorded right audio signal over a fourth conductor of the connector jack on the smart pen to be played back on a right speaker, the right speaker sharing a second housing with the right microphone.

17. The method of claim 16, further comprising:

processing the audio captured by the left microphone and the right microphone to adjust relative gain between a first audio source originating from a first direction and a second audio source originating from a second direction.

18. The method of claim 17, wherein processing the audio comprises adjusting the relative gain between the first audio source and the second audio source in real time and outputting processed audio to the left and right speakers.

19. The method of claim 17, further comprising:

retrieving an electronic representation of the captured handwriting gestures together with playing back the recorded audio.

20. The method of claim 17, wherein the left speaker is positioned facing into the left ear and the left microphone is positioned facing away from the left ear; and wherein the right speaker is positioned facing into the right ear and the right microphone is positioned facing away from the right ear.

21. A smart pen device for capturing handwriting gestures and for recording and playing back audio, comprising:

a connector jack, comprising:

a first conductor for receiving a left audio input signal to be recorded by the smart pen device, the first conductor coupled to a left microphone located proximate to a left ear;

a second conductor for receiving a right audio input signal to be recorded by the smart pen device, the second conductor coupled to a right microphone located proximate to a right ear;

a third conductor for transmitting a left audio output signal being played back by the smart pen device, the third conductor coupled to a left speaker located proximate to the left microphone and the left ear; and a fourth conductor for transmitting a right audio output signal being played back by the smart pen device, the fourth conductor coupled to a right speaker located proximate to the right microphone and the right ear;

wherein the smart pen device is configured to record the left audio input signal received over the first conductor and record the right audio input signal received over the second conductor, and to synchronize captured handwriting gestures in time with the left audio input signal and the right audio input signal.

* * * * *